(12) United States Patent
Jung

(10) Patent No.: US 6,337,496 B2
(45) Date of Patent: Jan. 8, 2002

(54) FERROELECTRIC CAPACITOR

(75) Inventor: Dong-jin Jung, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/348,296

(22) Filed: Jul. 7, 1999

(30) Foreign Application Priority Data

Jul. 7, 1998 (KR) .............................................. 98-27297

(51) Int. Cl.⁷ .......................... H01L 29/76; H01L 29/94; H01L 31/062; H01L 31/113; H01L 31/119
(52) U.S. Cl. ......................................... 257/295; 257/310
(58) Field of Search ................................... 257/295, 310, 257/296; 438/3, 240; 361/303, 305, 320, 321, 313

(56) References Cited

U.S. PATENT DOCUMENTS

| | | | |
|---|---|---|---|
| 5,206,788 A | * 4/1993 | Larson et al. ............... | 361/313 |
| 5,831,299 A | * 11/1998 | Yokoyama et al. ......... | 257/295 |
| 5,965,942 A | * 10/1999 | Itoh et al. ................... | 257/303 |
| 6,080,499 A | * 6/2000 | Eastep ........................ | 428/701 |

* cited by examiner

Primary Examiner—Tom Thomas
Assistant Examiner—Shouxiang Hu
(74) Attorney, Agent, or Firm—The Law Offices of Eugene M. Lee, PLLC

(57) ABSTRACT

A ferroelectric capacitor with a multilayer ferroelectric film to prevent degradation of its ferromagnetic characteristics, wherein the ferroelectric film is made of a lower layer of PZT or PLZT formed on a lower electrode and an upper, titanium rich, layer of PZT, PLZT, or $PbTiO_3$, an upper electrode formed on the upper layer of the ferroelectric film and a protective layer formed to cover the ferroelectric capacitor.

5 Claims, 8 Drawing Sheets

FERROELECTRIC CAPACITOR

BACKGROUND OF THE INVENTION

1. Field of the Invention

The invention relates generally to a ferroelectric capacitor containing a perovskite structure and a method for fabrication thereof and, more particularly, to a multilayer, titanium containing ferroelectric film having a perovskite structure and a method for fabrication thereof.

2. Description of the Related Art

Modern data processing systems require that a substantial portion of the information stored in their memory be randomly accessible to ensure rapid access to such information. Ferroelectric random access memories ("FRAMs") have been developed for data processing systems operating at high speed. FRAMs exhibit a significant advantage over conventional memories because they are nonvolatile. FRAMs are nonvolatile because they include a ferroelectric capacitor comprising a pair of capacitor plates with a ferroelectric material between them. The ferroelectric material has two different stable polarization states which can be defined with a hysteresis loop depicted by plotting the polarization against the applied voltage.

Recently, ferroelectric materials have been used commercially in the integrated circuit industry. Ferroelectric memories are nonvolatile, programmable with low voltage, such as a voltage of less than 5V (compared to conventional flash memories requiring, in 18–22V programming voltage), have a fast access time on the order of less than a nanosecond (compared to conventional flash memories with an access time on the order of a microsecond), and have a high robustness and endurance with respect to a virtually unlimited numbers of read and write cycles. The ferroelectric memories also consume low power (less than 1 microampere standby current) and exhibit radiation hardness.

Ferroelectric materials used in integrated circuit applications include perovskite crystal structure ferroelectric dielectric compounds, such as lead zirconium titanate ($PbZr_xTi_{1-x}O_3$ or "PZT"), barium strontium titanate ("BST"), and lead lanthanum zirconium titanate ("PLZT").

Important aspects of a ferroelectric memory fabrication process are the ability to obtain reliable ferroelectric characteristics without degradation and the formation of a one capacitor/one transistor structure and a multilevel metal structure. Particularly, in case of PZT, its ferroelectric characteristics are directly related to the degree of the perovskite crystallinity after post-deposition annealing. The degree of PZT perovskite crystallinity, and hence its ferroelectric characteristics, are closely related to the ratio of the zirconium to titanium contained in the PZT film.

FIG. 1A shows the relationship between cation content (in atomic %) of lead, zirconium and titanium in a PZT film and distance (in the thickness direction) from a bottom platinum electrode of a capacitor in the PZT film. In FIG. 1A, reference numeral 14 represents the titanium (i.e., Ti ion) content of the PZT film, reference numeral 12 represents the zirconium content of the PZT film and reference numeral 10 represents the lead content of the PZT film. As illustrated in FIG. 1A, the lead content is substantially constant for any distance from the lower electrode (i.e., without regard to the position in the PZT film). However, the content of zirconium and titanium varies significantly with the distance from the lower electrode. Particularly, the zirconium content 12 increases with an increase in distance from the lower electrode of the capacitor (i.e., a larger amount of zirconium is present at an upper portion of the PZT film, away from lower electrode, than at a lower portion of the PZT film, near the lower electrode). On the other hand, the titanium content 14 decreases with increase in the distance from the lower electrode of the capacitor (i.e., a larger amount of titanium is present at a lower portion of the PZT film, near the lower electrode, than at an upper portion of the PZT film, away from the lower electrode).

FIG. 1B shows the relationship between the distance from a lower platinum capacitor electrode and the ratio 18 of the lead content to the sum of the zirconium and titanium content (i.e., [Pb]/[Zr+Ti]) in the PZT film. FIG. 1B also shows the relationship between the distance from the lower electrode and the ratio 16 of the zirconium content to the titanium content in the PZT film (i.e., [Zr]/[Ti]). As can be seen, the lead to zirconium and titanium ratio 18 is substantially constant with distance from the lower electrode, while the zirconium to titanium ratio 16 varies significantly with the distance from the lower electrode.

The variation in the zirconium to titanium ratio with distance from the lower electrode is due to heterogeneous PZT formation and the dependence of the PZT composition on the composition of the capacitor electrodes. The variation in the zirconium to titanium ratio is especially severe when platinum is used as an upper capacitor electrode. Platinum acts as a catalyst in a reduction reaction to further reduce the titanium content in the upper portion of the PZT film near the interface between the upper electrode and the PZT film. The titanium deficiency at the upper portions of the PZT film decreases the perovskite crystallinity of the PZT film and thus decreases FRAM reliability. The present invention is directed to overcoming or at least reducing the effects of one or more of the problems set forth above.

SUMMARY OF THE INVENTION

In accordance with one aspect of the invention there is provided a ferroelectric capacitor, comprising a first electrode, a second electrode and a ferroelectric film between the first electrode and the second electrode, wherein an upper portion of the ferroelectric film contains a higher titanium concentration that a lower portion of the ferroelectric film.

In accordance with another aspect of the invention there is provided a method for fabricating a ferroelectric capacitor, comprising forming a first electrode over a substrate, forming a ferroelectric film over the first electrode, wherein an upper portion of the ferroelectric film contains a higher titanium concentration than a lower portion of the ferroelectric film, and forming a second electrode over the ferroelectric film.

In accordance with yet another aspect of the invention there is provided a method of forming a ferroelectric film having a perovskite structure, comprising forming a ferroelectric layer having a perovskite structure and containing an upper region having a lower titanium concentration than a lower region and supplementing the ferroelectric layer to form a ferroelectric film having a substantially uniform titanium concentration throughout its thickness.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Figure 1A:
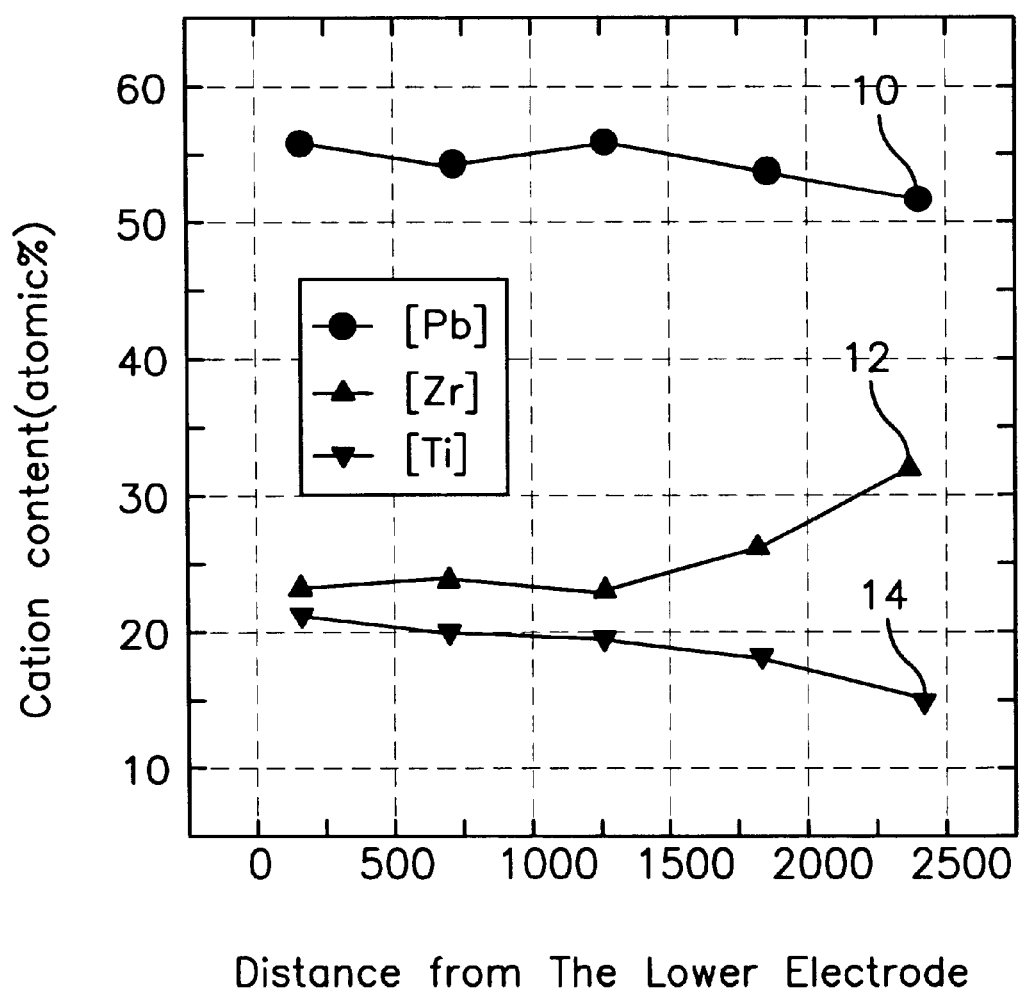
FIG. 1A is a graph showing the relationship between distance from a lower electrode in a PZT film and cation content (in atomic %) of the PZT film.

Korean application no. 98-27297, filed Jul. 7, 1998, is hereby incorporated by reference as if fully set forth herein.

The preferred aspects of the present invention were made in view of the above described problem. The preferred aspects of the invention provide a ferroelectric memory device with improved ferroelectric characteristics, such as high temperature retention and high read/write endurance.

In the preferred aspects of the present invention, a second ferroelectric layer is formed on a first ferroelectric layer. The second ferroelectric layer contains a higher titanium concentration than zirconium concentration to compensate a titanium deficiency at an upper portion of the first ferroelectric layer. The first ferroelectric layer may comprise PZT. The second ferroelectric layer may comprise PZT containing a higher concentration of titanium than zirconium. Alternatively, the second ferroelectric layer may comprise $PbTiO_3$, which can suppress or decrease titanium out diffusion from the first ferroelectric layer into the second ferroelectric layer.

The method for fabricating a ferroelectric capacitor according to the preferred aspects of the present invention includes forming a first insulating layer over a semiconductor substrate containing a plurality of transistors. A ferroelectric capacitor including a lower electrode, a ferroelectric film and an upper electrode is formed on the first insulating layer. The lower electrode is preferably made of a multilayer film comprising a conductive oxide layer, such as iridium dioxide ($IrO_2$), and a platinum layer. The platinum layer is used to advantageously provide a favorable crystalline structure for the ferroelectric film deposition. Other suitable electrodes may also be used.

The upper electrode is preferably made of metal selected from the group consisting of iridium, rhodium and ruthenium, but may also comprise platinum if desired. Alternatively, the upper electrode may be made of multilayer film comprising a conductive oxide layer, such as $IrO_2$, ITO, $RhO_2$, $MoO_3$ or the like, and a metal layer, such as platinum, iridium, rhodium, ruthenium, or the like, preferably in this order.

A photolithography process is used pattern the ferroelectric capacitor. After patterning the capacitor, a protective layer may be formed to cover the capacitor. The protective layer may comprise $TiO_2$, in order to prevent or decrease out diffusion of capacitor materials. Alternatively, a titanium rich PZT or a $PbTiO_3$ layer can be used instead. Subsequently, the capacitor and transistor are electrically connected.

The preferred aspects of the present invention will now be described more fully with reference to the accompanying drawings. The present invention may, however, be embodied in different forms and should not be construed as being limited to the preferred aspects described below. In the drawings, the thickness of layers and regions are exaggerated for clarity. Furthermore, when a first layer is referred to as being 'on' a second layer or a substrate, the first layer may be directly on the second layer or the substrate, or alternatively, intervening layers may be present between the first layer and the second layer or the substrate. The preferred aspects of the present invention are directed to a ferroelectric capacitor. Therefore, the process for forming the device isolation region and the transistor structure are only briefly described in order to better understand the preferred aspects of the present invention.

Figure 2A:
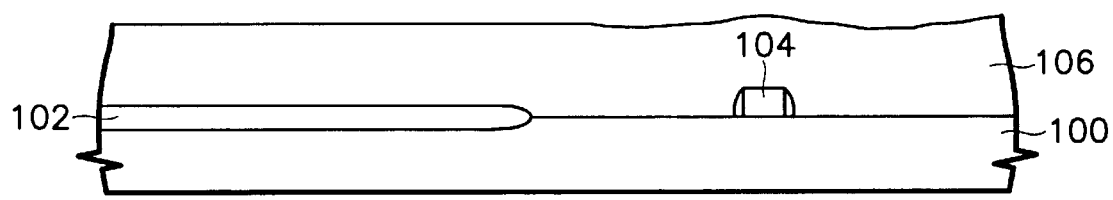
FIGS. 2A, 2B, 2C, 2D, 2E, 2F and 2G are cross-sectional views of a memory device at selected stages of a manufacturing process according to a preferred embodiment of the present invention.

The first preferred embodiment of the present invention will now be described. Referring to FIG. 2A, an active region of a semiconductor substrate 100 contains a transistor 104 and a first insulating layer 106 overlying the transistor 104. The active region is surrounded by device isolation regions 102 (only one is shown in FIG. 2A for clarity). The substrate 100 preferably comprises silicon. Alternatively, the substrate may comprise a semiconductor layer, such as silicon, over an insulating layer or a glass plate, or a non-silicon semiconductor wafer, such as a gallium arsenide wafer. The isolation layer 102 may comprise any insulating material, such as a silicon oxide layer formed by the LOCOS process or by a trench refill process. The transistor 104 is preferably a MOSFET, including a gate electrode containing an insulating capping layer (not shown) and sidewall spacers, and a pair of source/drain regions (not shown) extended from lateral edges of the gate electrode within the active region of the substrate 100. A first insulating layer 106 is deposited on the transistor 104 and over the semiconductor substrate 100. Insulating layer 106 may be any insulating layer, such as silicon oxide, silicon nitride, silicon oxynitride, doped silicon oxide (i.e., BPSG or fluorine doped silicon oxide) or a combination of the above layers.

Figure 2B:
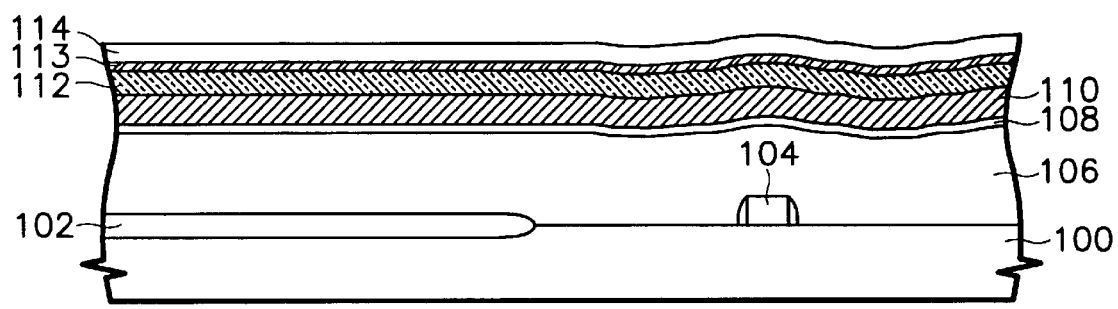

Referring now to FIG. 2B, an adhesion 108 is formed over the first insulating layer 106. The adhesion 108 serves to enhance adhesion between the first insulating layer 106 and a later formed lower electrode of a ferroelectric capacitor. Also, the adhesion layer 108 may serve as a barrier layer to prevent diffusion of impurities from the capacitor into the insulating layer 106 and visa versa. The adhesion layer 108 may comprise any material that is capable of enhancing adhesion and/or preventing impurity diffusion, such as titanium dioxide ($TiO_2$). Alternatively, if desired, the adhesion layer 108 may be omitted.

A lower electrode 110 of the ferroelectric capacitor is then formed on the adhesion layer 108. For example, an about 2,700 Å thick platinum layer can be used as the lower electrode 110. Platinum is preferred as the electrode material because it provides a favorable underlying lattice structure with a later formed ferroelectric film, to obtain a ferroelectric film having a lattice structure with fewer lattice defects. Alternatively, the lower electrode 110 may comprise other materials, such as iridium (Ir), rhodium (Rh) and ruthenium (Ru).

Alternately, the lower electrode 110 could comprise plural layers. For example, electrode 110 could comprise a first conductive oxide layer and a second metal layer, such as Pt, Ir, Rh and Ru, deposited in any order. The conductive oxide film may comprise iridium dioxide ($IrO_2$), indium tin oxide (ITO), rhodium oxide ($RhO_2$), ruthenium oxide ($RuO_2$) or molybdenum oxide ($MoO_3$) made by a DC magnetron sputtering technique.

After forming the lower electrode 110, ferroelectric layers 112 and 113 are formed on the lower electrode 110. More specifically, a lower layer of ferroelectric material 112 is formed on the lower electrode 110. The lower ferroelectric layer preferably comprises PZT. However, the lower ferroelectric layer 112 may comprise other ferroelectric materials, such as PLZT. The layer 112 is preferably formed to a thickness of 1,500 to 3,500 Å, most preferably to about 2,500 Å. However, layer 112 may be formed to any other desired thickness. Layer 112 is preferably formed by depositing an amorphous layer by a sol-gel method and then annealing the amorphous layer to transform the amorphous layer into a ferroelectric layer having a perovskite crystal structure.

Figure 1B:
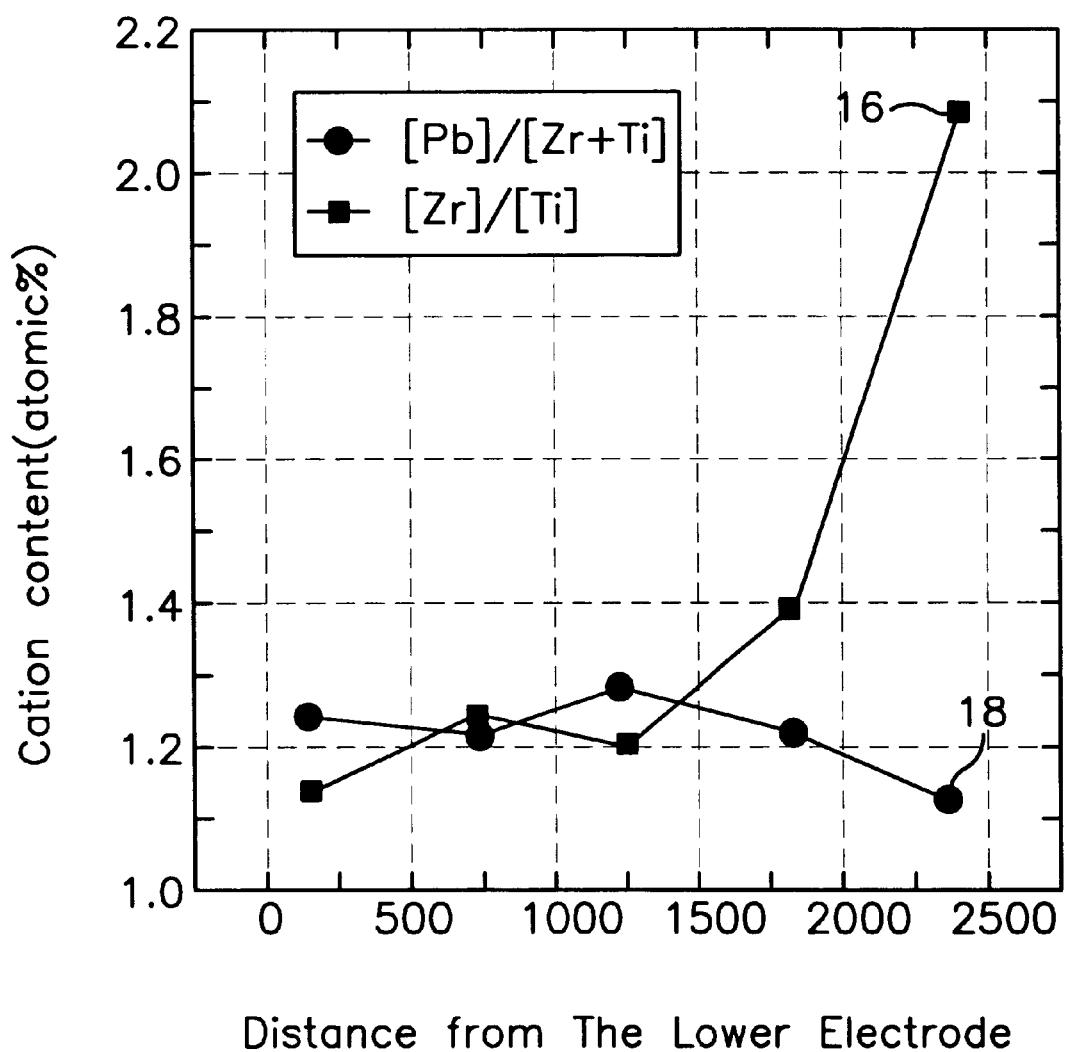
FIG. 1B is a graph showing the relationship between the distance from the lower electrode and a ratio of lead to zirconium and titanium and the relationship between the distance from the lower electrode and a ratio of zirconium to titanium in a PZT film.

Since PZT grows heterogeneously, as the PZT layer thickness increases (i.e., the film grows upward) its crystalline structure deteriorates. Namely, the top portion of the PZT layer 112 has a poor crystalline structure (i.e., the top film portion contains a large quantity of lattice defects and/or lacks a perovskite crystal structure) because the ratio of zirconium to titanium increases with increasing film thickness, as shown in FIGS. 1A and 1B. To compensate the titanium deficiency, an upper ferroelectric layer 113 is formed on the top surface of the lower ferroelectric layer 112 to a thickness of preferably 500 to 1500 Å, most preferably to about 1,000 Å. The upper ferroelectric layer 113 has a higher titanium content than the lower ferroelectric layer.

Preferably, the upper ferroelectric layer 113 comprises titanium rich PZT (containing a larger amount of titanium than zirconium) or titanium rich PLZT. Alternately, the upper ferroelectric layer may contain substantially no zirconium and comprise lead titanate ($PbTiO_3$). $PbTiO_3$ serves to further increase the titanium content of the upper layer 113. The excess titanium in the upper layer 113 may diffuse into an upper part of the lower layer 112 to increase titanium content of the upper part of the lower layer 112 and may prevent or decrease out diffusion of titanium from the lower layer 112. Furthermore, the substrate 100 could be annealed after formation of layer 113 to enhance the diffusion of titanium from the upper layer 113 into the lower layer 112. Layer 113 is preferably formed by depositing an amorphous layer by a sol-gel method and then annealing the amorphous layer to transform the amorphous layer into a ferroelectric crystalline layer. Alternatively, the annealing step after depositing layer 112 may be omitted, and a single annealing step may be used to transform amorphous layers 112 and 113 into a ferroelectric crystalline film.

After forming the dual layer ferroelectric film 112 and 113, an upper capacitor electrode 114 is formed on the upper layer 113. The upper electrode 114 may be made of a metal such as iridium, rhodium or ruthenium. Alternately, the upper electrode 114 could comprise plural layers. For example, electrode 114 could comprise a first conductive oxide film and a second metal film, such as Pt, Ir, Rh or Ru, deposited in any order. The conductive oxide film may comprise iridium dioxide ($IrO_2$), indium tin oxide (ITO), rhodium oxide ($RhO_2$), ruthenium oxide ($RuO_2$) or molybdenum oxide ($MoO_3$).

Even if platinum is used as the upper electrode 114 metal, the presence of the titanium rich upper ferroelectric layer 113 prevents a severe variation in the zirconium to titanium ratio. The platinum catalyzed reduction reaction does not sufficiently deplete the titanium content of the titanium rich layer 113 to form a severely titanium depleted region at the interface of the ferroelectric film and the upper electrode.

Figure 2C:
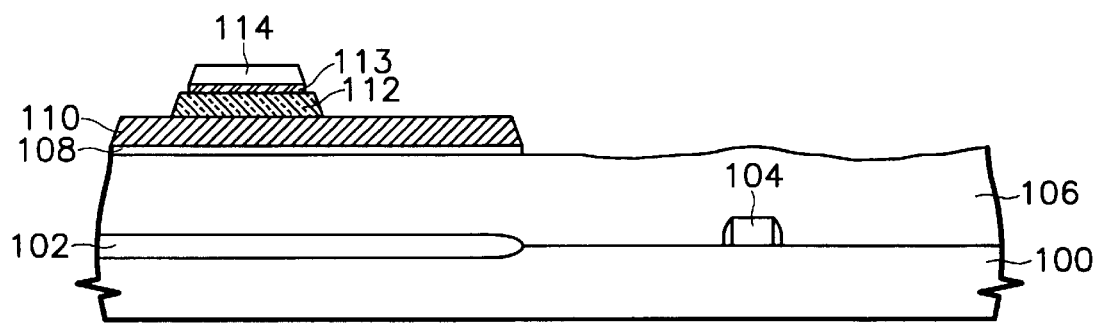

Referring to FIG. 2C the upper electrode layer 114 is patterned, preferably by an anisotropic etching method, such as by reactive ion etching (RIE), to form an upper electrode pattern. The layers 110, 112 and 113 are subsequently patterned to form the ferroelectric capacitor film and the lower capacitor electrode 110. Layers 110, 112 and 113 may be patterned by several different etching techniques.

Figure 3A:
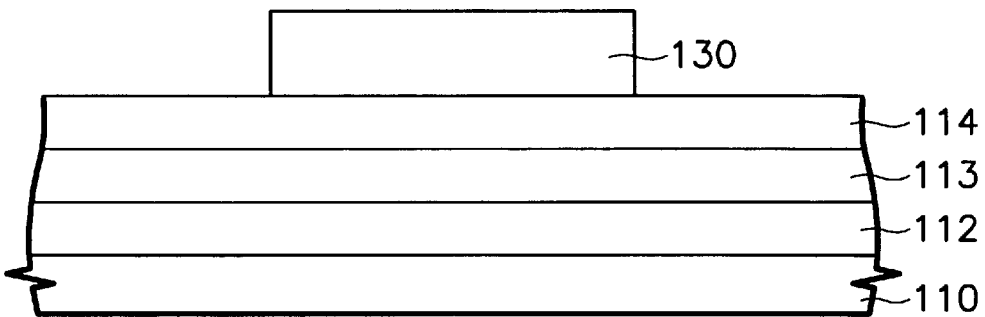
FIGS. 3A, 3B, 3C and 3D are cross-sectional views of a capacitor at selected stages of an etching process according to a preferred embodiment of the present invention.
Figure 3B:
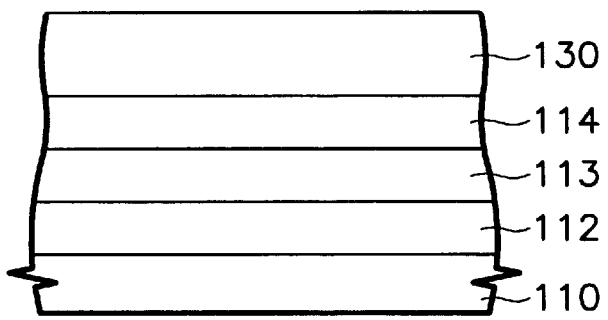
Figure 3C:
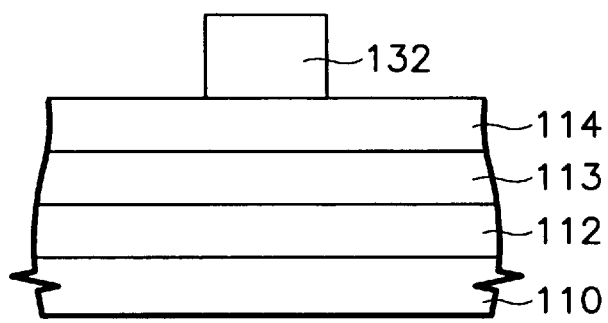
Figure 3D:
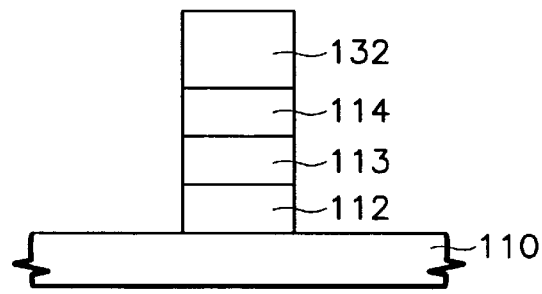

For example, layers 110, 112, 113 and 114 may be etched using a first photoresist pattern 130 as shown in FIGS. 3A and 3B. Subsequently, a second photoresist pattern 132 having a narrower width than the first pattern 130 may be formed on the upper electrode 114, as shown in FIG. 3C. Layers 112, 113 and 114 may be etched a second time to form layers 112, 113 and 114 whose width is smaller than the width of layer 110, as shown in FIGS. 2C and 3D.

In an alternative aspect of the invention, the lower electrode 110 and the adhesion layer 108 may be patterned using the first photoresist pattern 130 before layers 112, 113 and 114 are deposited. Layers 112, 113 and 114 may be subsequently patterned using the second photoresist pattern 132. In another alternative aspect of the invention, layers 112, 113 and 114 may first be patterned using the second photoresist pattern 132. The first photoresist pattern 130 may then be formed over the patterned layers 112, 113 and 114, and layers 110 and 108 may then be etched using the photoresist 130 as a mask.

Similar etching and photolithography techniques may be used if it is desired to form layer 112 having a width greater than that of layers 113 and/or 114. Preferably, the substrate 100 is annealed in an oxygen ambient at a temperature of about 450° C. or more after the etching in order to reduce etching damage in layers 112 and 113.

Figure 2D:
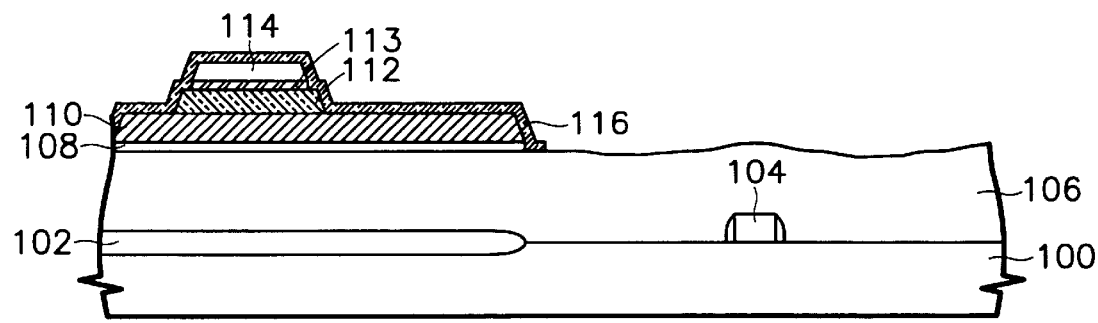

As showed in FIG. 2D, a protective layer 116 is then formed on the ferroelectric capacitor and on the first insulating layer 106, preferably to a thickness of about 500 Å to 1,000 Å. In one preferred aspect of the invention, the protective layer 116 may comprise titanium dioxide ($TiO_2$) to prevent or decrease the diffusion of impurities to and from the ferroelectric capacitor. Preferably, the titanium dioxide layer 116 is annealed in an oxygen ambient at a temperature of about 650° C. or more to enhance its diffusion barrier properties.

In an alternative aspect of the present invention, the protective layer 116 could comprise a titanium rich PZT layer containing a larger amount of titanium than zirconium or a $PbTiO_3$ layer. The advantage of using a perovskite ceramic layer as the protective layer is that the perovskite protection layer 116 provides an additional source of titanium for the two ferroelectric layers 112 and 113. The protective layer 116 is patterned by etching to form the structure shown in FIG. 2D. In another aspect of the present invention, the protective layer 116 may be omitted if desired.

Figure 2E:
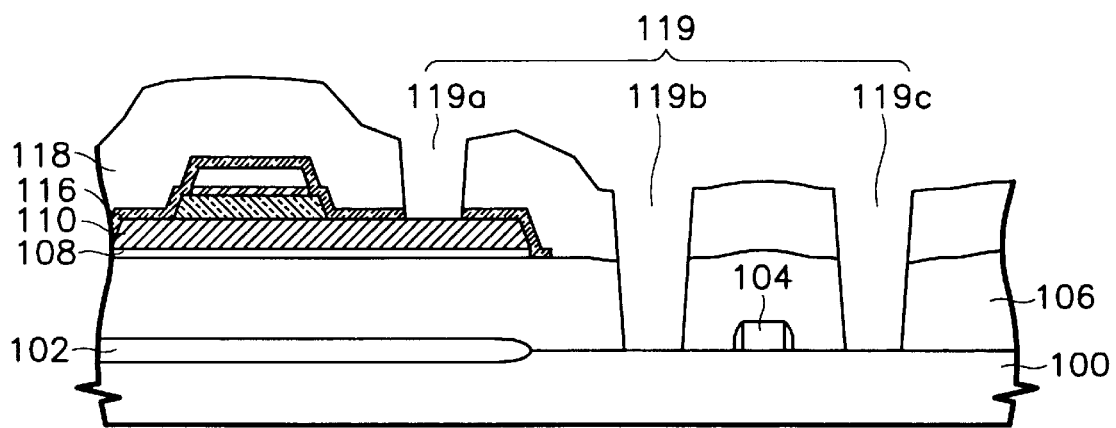

Referring to FIG. 2E, a second insulating layer 118 is formed over the resulting structure. The second insulating layer could comprise silicon oxide, silicon nitride, silicon oxynitride, doped silicon oxide (i.e., BPSG or fluorine doped silicon oxide), spin-on-glass or a combination of the above layers, despotised, for example, by CVD (chemical vapor deposition) or sputtering.

The second insulating layer 118, the first insulating layer 106 and the protective layer 116 are etched to form first openings or vias 119. Opening 119a exposes the lower electrode 110 and openings 119b and 119c expose the source and drain regions of the transistor 104.

Figure 2F:
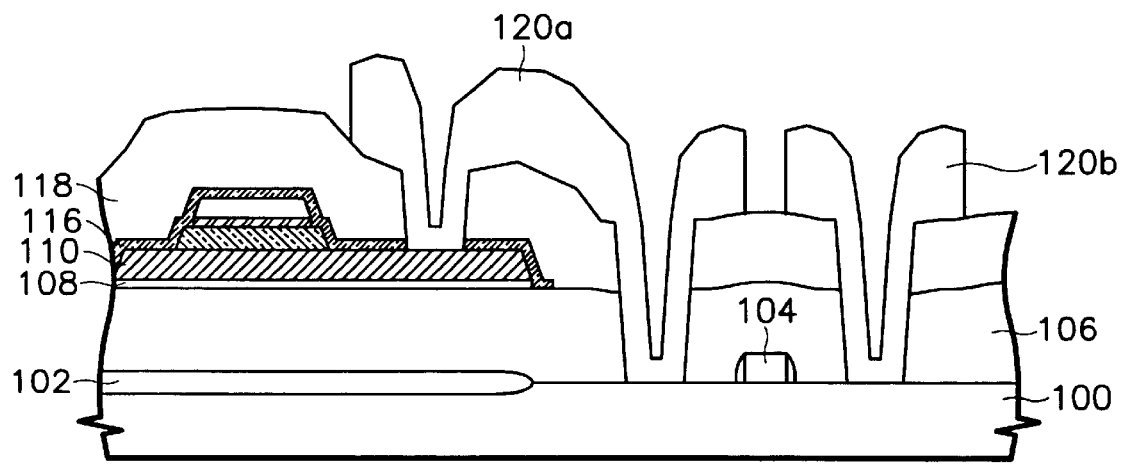

Multilevel metallization is formed after the etching of the openings 119, as shown in FIG. 2F. A first level metallization is deposited in openings 119. The first level metallization may comprise any single or plural metal layers, such as aluminum, titanium, titanium nitride, a silicide such as titanium silicide, copper or tungsten.

In a preferred aspect of the present invention, the first level metallization comprises a four metal layer composite. First, a titanium layer is deposited in the first openings 119 to a thickness of about 300 Å. Then, a titanium nitride layer is deposited on the titanium layer to a thickness of about 900 Å. Then, an aluminium layer is deposited on the titanium nitride layer to a thickness of about 6,000 Å. Finally a titanium nitride layer is deposited on the aluminium layer to a thickness of about 250 Å. However, other metal layers may be used.

The first level metallization layer is then patterned as shown in FIG. 2F. A first portion 120a of the first level metallization electrically connects the lower electrode 110 of the capacitor to a source or drain region of the transistor 104. A second portion 120b of the first level metallization is electrically connected to a drain or a source of the transistor 104.

Figure 4A:
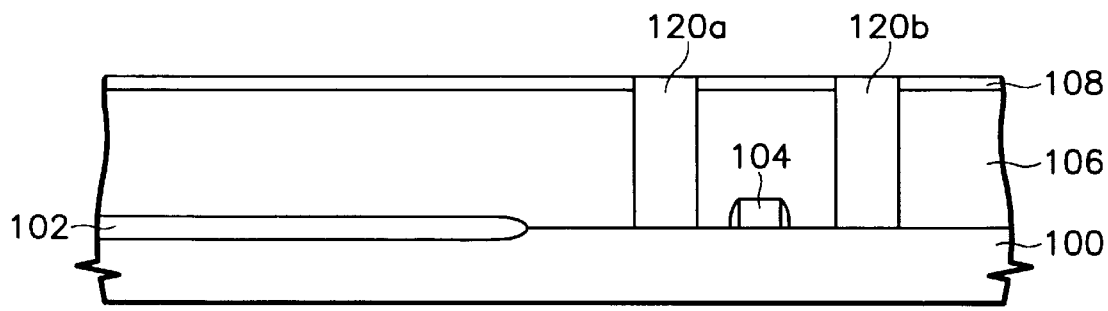
FIGS. 4A and 4B are cross-sectional views of a memory device at selected stages of a manufacturing process according to an alternative aspect of a preferred embodiment of the present invention.
Figure 4B:
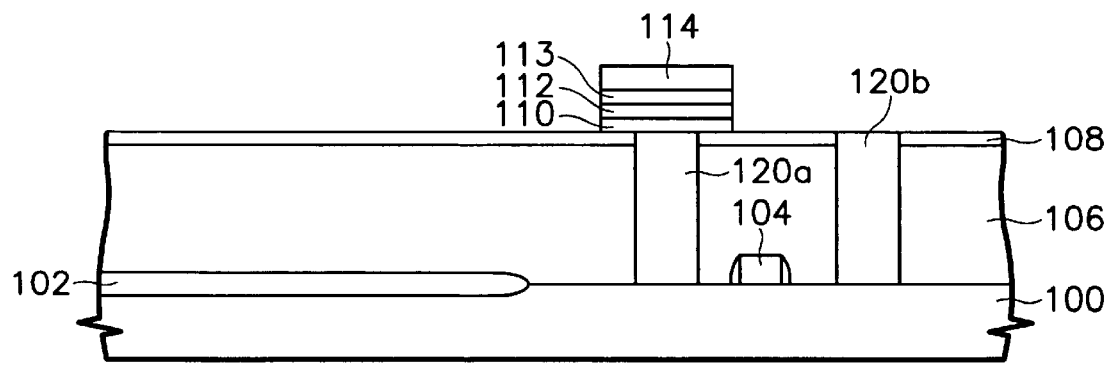

In an alternative aspect of the invention, the first level metallization 120 may be formed prior to forming the lower electrode 110 of the capacitor. As shown in FIG. 4A, first level metallization 120a and 120b is formed in openings in the first insulating layer 106 and the adhesion layer 108. Metallization 120a, 120b may formed by the so-called "pillar method" where the first insulating layer 106 and the adhesion layer 108 are formed around patterned metal pillars 120a and 120b. Alternatively, openings may be formed in layers 106 and 108 and the metallization portions 120a, 120b may then be formed in the openings by selective deposition or by patterning. The lower electrode 110 of the capacitor is then formed on the metallization portion 120a, as shown in FIG. 4B. This aspect is advantageous because the capacitor is formed directly over the source or drain of the transistor. Therefore, the width of the FRAM device is decreased.

Figure 2G:
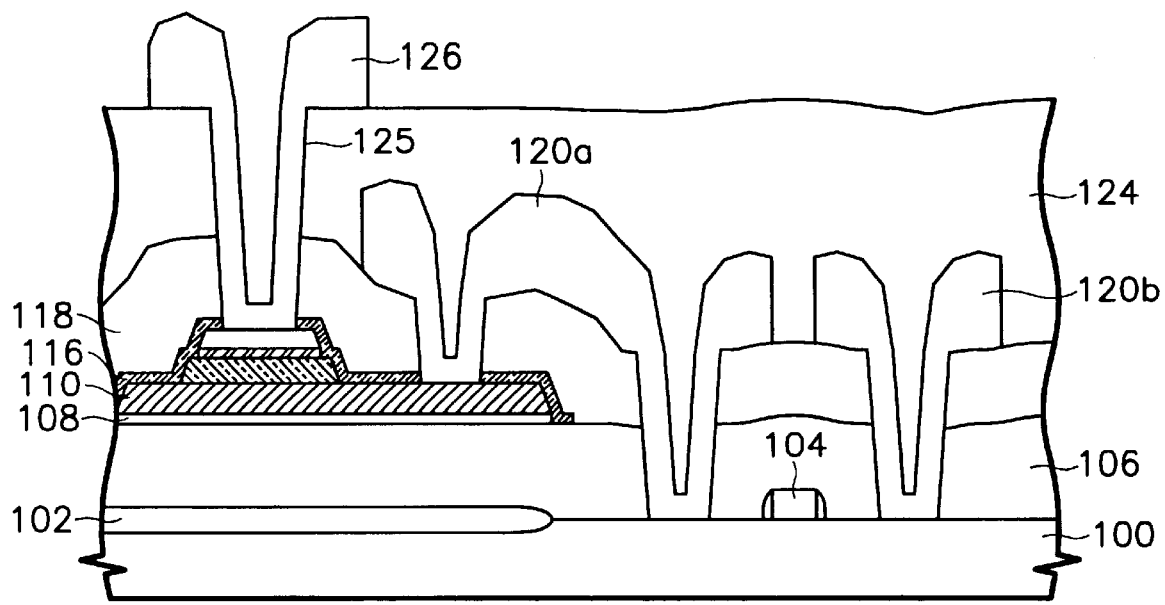

As shown in FIG. 2G, after formation of the first level metallization 120, an intermetal dielectric comprising a third insulating layer 124 is deposited on the second insulating layer 118 and on the first level metallization. The third insulating layer could comprise silicon oxide, silicon nitride, silicon oxynitride, doped silicon oxide (i.e., BPSG or fluorine doped silicon oxide), spin-on-glass or a combination of the above layers, deposited, for example, by CVD (chemical vapor deposition) or sputtering.

In a preferred aspect of the present invention, the third insulating layer 124 may comprise a dual insulating layer. A first 6,500 Å-thick silicon oxide layer is formed by ECR (electron cyclotron resonance) CVD technique. This layer is then planarized by etch back or chemical mechanical polishing, and a second 6,500 Å-thick ECRCVD oxide layer is formed on the first oxide layer. In another preferred aspect of the present invention, the second oxide layer may comprise a silicon oxide layer from form a TEOS (tetraethylorthosilicate) source by CVD.

After forming the third insulating layer 124, second openings or vias, such as opening 125, are formed in the third insulating layer 124, the second insulating layer 118 and the protective layer 116 to the upper capacitor electrode 114. Though not shown, another second opening may be formed in the third insulating layer 124 to the first level metallization at the core/peripheral region of the memory device. Preferably, the structure is annealed in an oxygen ambient at a temperature of about 450° C. or more in order to cure the etching damage and to form a titanium silicide layer between the source and drain regions and first level metallization.

A second level metallization 126 is then formed over the third insulating layer 124 to contact the upper capacitor electrode 114 through the second opening 125. The second level metallization may comprise any single or plural metal layers, such as aluminum, titanium, titanium nitride, a silicide such as titanium silicide, copper or tungsten. In a preferred aspect of the present invention, the second level metallization is formed by depositing an about 6,000 Å-thick aluminum layer and an about 250 Å-thick titanium nitride layer in the second opening 125, followed by etching the metal layers. In an alternative aspect of the invention, the lower capacitor electrode 110 may be connected to the peripheral region of the memory device and the upper capacitor electrode 114 may be connected to the transistor 104.

The first preferred embodiment of the present invention provides a ferroelectric capacitor with a dual layer ferroelectric film. The upper layer of the dual layer ferroelectric film contains a larger amount of titanium than zirconium, in order to provide an improved composition ratio of the ferroelectric material which improves the ferroelectric characteristics of the film. In the preferred embodiment described above, the ferroelectric material with an improved composition ratio was obtained by forming a second ferroelectric material layer on a first ferroelectric material layer, wherein the second ferroelectric material layer contains a higher titanium concentration than the first ferroelectric layer. However, the ferroelectric material with an improved composition ratio may be obtained by other methods.

In a second preferred embodiment of the invention, layer 113 comprises a titanium metal layer instead of a titanium containing ceramic material. The titanium layer 113 may be deposited by any known deposition method, such as CVD, evaporation or sputtering. The structure may be annealed at 650° C. or higher after the deposition of the titanium layer 113 to diffuse the titanium from layer 113 into the upper, titanium deficient portion of layer 112, to create a ferroelectric film having a substantially uniform titanium concentration (i.e., not necessarily a perfectly uniform concentration, but more uniform than that shown in FIGS. 1A and 1B) and an improved perovskite crystal structure.

In a third preferred embodiment of the invention, layer 113 is omitted. Instead, titanium ions are ion implanted into the upper, titanium deficient portion of layer 112. The implanted titanium ions may be activated by annealing layer 112 at 650° C. or higher to create a ferroelectric film having a substantially uniform titanium concentration and an improved perovskite crystal structure throughout its thickness. Alternatively, two or more doses of titanium ions may be implanted into layer 112. A higher dose of titanium ions may be implanted near the top surface of layer 112 that is most titanium deficient, and a lower dose of titanium may be implanted further away from the top surface of layer 112 that is less titanium deficient, to create a ferroelectric layer having a substantially uniform titanium concentration.

In a fourth preferred embodiment of the invention, the formation of the ferroelectric film is optimized to obtain a substantially uniform titanium concentration throughout its thickness. The first optimization step is a determination of the difference in titanium concentration between the upper region and the lower region of the lower ferroelectric layer 112 (i.e., the non uniformity of titanium concentration along the thickness direction of layer 112). The determination may comprise a calculation or simulation of the film composition based, for example, on the deposition conditions or method of layer 112, and on whether platinum would be used in a device that include, layer 112, such as in a capacitor including a platinum electrode. Alternatively, instead of a calculation or simulation, the composition of the deposited layer 112 may be determined by various known characterization techniques.

Once the extent of the titanium deficiency in layer 112 is determined, layer 112 may be supplemented in a second optimization step to obtain a ferroelectric film having a substantially uniform titanium concentration throughout its thickness. For example, in the first and second embodiments of the present invention, layer 112 may be supplemented by diffusing titanium from layer 113 to reduce or eliminate a titanium deficiency in the top portion of layer 112.

The composition and thickness of layer 113 may be selected to obtain a uniform titanium concentration in the ferroelectric film comprising layers 112 and 113. For example, in the first preferred embodiment, if the titanium deficiency in layer 112 is not significant, then layer 113 may comprise titanium rich PZT whose [Ti]/[Zr] ratio is slightly above one. If the titanium deficiency in layer 112 is significant, then layer 113 may comprise lead titanate or titanium rich PZT whose [Ti]/[Zr] ratio is more than slightly above one. Furthermore, in the first and second preferred embodiments, the temperature and duration of the optional annealing treatment used to diffuse titanium from layer 113 to layer 112 or of the crystallization annealing treatment of layers 112 and 113, as well as the thickness of layer 113, may be selected to obtain a substantially uniform titanium concentration throughout the ferroelectric film.

Alternatively, in the third preferred embodiment, the dose, the implantation depth, the number of implantation steps, the annealing temperature and the duration of the annealing treatment may be optimized to obtain substantially uniform titanium concentration in layer 112. For example, if the titanium deficiency in layer 112 is not significant, then a single, shallow, low dose titanium implantation may be required to obtain a substantially uniform titanium concentration in layer 112. If the titanium deficiency in layer 112 is significant, then a first, shallow, high dose and a second, deep, low dose titanium implantation steps may be required to obtain a substantially uniform titanium concentration in layer 112.

It will be recognized by those skilled in the art that the innovative concepts disclosed in the present application can be applied in a wide variety of contexts. Moreover, the preferred implementation can be modified in a variety of ways. Accordingly, it should be understood that the modification and variations suggested below and above are merely illustrative. For example, a capacitor having a planar shape is shown in FIG. 2. However, the capacitor may have a non-planar shape, such as a "U" shape, a "trident" shape, a "T" shape or an "F" shape. The ferroelectric material may comprise other titanium containing materials other than PZT or PLZT, such as BST. Furthermore, a stacked capacitor (i.e., a capacitor formed above the first insulating layer 106) is shown in FIG. 2. However, the capacitor may be formed on the same plane as the transistor 104 (i.e., below layer 106) or in a trench in the substrate 100 (i.e., a trench capacitor). Finally, the described perovskite material having a substantially uniform titanium composition could be used in applications other than FRAMs or capacitors.

Thus, a ferroelectric capacitor and a method for fabricating thereof have been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A ferroelectric capacitor, comprising:
   a first electrode;
   a second electrode; and
   a ferroelectric film having a lower portion and an upper portion between the first electrode and the second electrode, wherein the lower portion of the ferroelectric film comprises a first layer comprising a material selected from the group consisting of PZT and PLZT and the upper portion of the ferroelectric film comprises a second layer comprising a material selected from the group consisting of titanium rich PZT containing a titanium to zirconium ratio of greater than one, titanium rich PLZT having a titanium to zirconium ratio of greater than one, and PbTiO$_3$; and
   wherein the upper portion of the ferroelectric film contains a higher titanium to zirconium concentration ratio than the lower portion of the ferroelectric film.

2. The ferroelectric capacitor of claim 1, wherein the first layer has a thickness of about 2,500 Å and the second layer has a thickness of about 1,000 Å.

3. The ferroelectric capacitor of claim 1, wherein the first and the second electrodes comprise:
   a) a metal selected from a group consisting of Pt, Ir, Ru, and Rh; or
   b) a third electrode layer selected from a group consisting of IrO$_2$, ITO, RhO$_2$, RuO$_2$, and MoO$_3$ and a fourth electrode layer selected from the group consisting of Pt, Ir, Rh, and Ru.

4. The ferroelectric capacitor of claim 1, further comprising a ferroelectric memory device, wherein the ferroelectric memory device comprises:
   a substrate;
   a transistor over the substrate; and
   a metal film connecting the first electrode and the transistor.

5. The ferroelectric capacitor of claim 4, wherein the ferroelectric memory device further comprises:
   a first insulating layer between the substrate and the first electrode;
   a diffusion barrier between the first insulating layer and the first electrode; and
   a protective layer over the second electrode.

* * * * *